US012288806B2

(12) United States Patent
Ozawa et al.

(10) Patent No.: US 12,288,806 B2
(45) Date of Patent: *Apr. 29, 2025

(54) SEMICONDUCTOR DEVICE

(71) Applicant: RENESAS ELECTRONICS CORPORATION, Tokyo (JP)

(72) Inventors: Kodai Ozawa, Tokyo (JP); Sho Nakanishi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/469,799

(22) Filed: Sep. 19, 2023

(65) Prior Publication Data
US 2024/0006487 A1 Jan. 4, 2024

Related U.S. Application Data

(63) Continuation of application No. 17/516,104, filed on Nov. 1, 2021, now Pat. No. 11,798,990.

(30) Foreign Application Priority Data

Nov. 4, 2020 (JP) ................. 2020-184270

(51) Int. Cl.
*H01L 29/08* (2006.01)
*H01L 29/739* (2006.01)
*H01L 29/861* (2006.01)

(52) U.S. Cl.
CPC ...... *H01L 29/0808* (2013.01); *H01L 29/7393* (2013.01); *H01L 29/8611* (2013.01)

(58) Field of Classification Search
CPC ............. H01L 29/0808; H01L 29/8611; H01L 29/405; H01L 29/7395; H01L 29/0615;
(Continued)

(56) References Cited

U.S. PATENT DOCUMENTS 6,281,528 B1 * 8/2001 Wada ............... H01L 29/7785
257/E29.25
10,069,017 B2 * 9/2018 Umeki .............. H01L 29/87
(Continued)

FOREIGN PATENT DOCUMENTS

EP 0 615 291 A1 9/1994
JP 08-130317 A 5/1996
(Continued)

OTHER PUBLICATIONS

Extended European Search Report issued in corresponding European Patent Application No. 21205843.2-1212, dated Mar. 25, 2022.
(Continued)

*Primary Examiner* — Shahed Ahmed
(74) *Attorney, Agent, or Firm* — Rimon P.C.

(57) ABSTRACT

The semiconductor device has the main surface, the semiconductor substrate having the first impurity region formed on the main surface, the first electrode formed on the main surface having the first impurity region, the insulating film formed on the main surface such that surround the first electrode, the second electrode formed on the insulating film such that spaced apart from the first electrode and annularly surround the first electrode, and the semi-insulating film. The first electrode has the outer peripheral edge portion. The semi-insulating film is continuously formed from on the outer peripheral edge portion to on the second electrode. The outer peripheral edge portion includes the first corner portion. The second electrode has the second corner portion facing the first corner portion. The semi-insulating film on the insulating film is removed between the first corner and the second corner portion.

6 Claims, 17 Drawing Sheets

(58) Field of Classification Search
CPC . H01L 29/66136; H01L 29/861; H01L 29/41; H01L 29/872–8725; H01L 29/66143; H01L 29/66212; H01L 29/868; H01L 2924/12031; H01L 29/66325–66348; H01L 29/7393–7398; H01L 29/402–407; H01L 29/8605

See application file for complete search history.

(56) References Cited

U.S. PATENT DOCUMENTS

| | | | |
|---|---|---|---|
| 2010/0025820 A1 | 2/2010 | Suekawa | |
| 2017/0263703 A1* | 9/2017 | Okumura | H01L 29/8613 |
| 2018/0233554 A1* | 8/2018 | Mitsuzuka | H01L 29/402 |
| 2020/0083133 A1* | 3/2020 | Kahn | H01L 23/564 |
| 2022/0037514 A1* | 2/2022 | Harada | H01L 29/0619 |
| 2022/0122966 A1* | 4/2022 | Nishi | H01L 29/0696 |

FOREIGN PATENT DOCUMENTS

| | | |
|---|---|---|
| JP | 2001-352064 A | 12/2001 |
| JP | 2012-182302 A1 | 9/2012 |
| WO | 2015/104900 A1 | 7/2015 |

OTHER PUBLICATIONS

U.S. PTO Non-Final Office Action issued in related U.S. Appl. No. 17/516,104, mailed Feb. 15, 2023.

U.S. PTO Notice of Allowance issued in related U.S. Appl. No. 17/516,104, mailed Jul. 11, 2023.

Notice of Reasons for Refusal received in corresponding Japanese Patent Application No. 2020-184270, dated Mar. 5, 2024.

* cited by examiner

SEMICONDUCTOR DEVICE

CROSS-REFERENCE TO RELATED APPLICATIONS

This is a Continuation of U.S. patent application Ser. No. 17/516,104 filed on Nov. 1, 2021, which claims priority from Japanese Patent Application No. 2020-184270 filed on Nov. 4, 2020 including the specification, drawings and abstract are incorporated herein by reference in their entirety.

BACKGROUND

The present disclosure relates to a semiconductor device. Japanese Patent Laid-Open No. 8-130317 (Patent Document 1) describes diode. The diode according to Patent Document 1 includes a semiconductor substrate, an insulating film, an anode electrode, an equipotential ring electrode, and a semi-insulating film.

The semiconductor substrate has a first n-type region, a second n-type region, and a p-type region. The first n-type region is on a back surface of the semiconductor substrate. The second n-type region is on a main surface of the semiconductor substrate in contact with the first n-type region. The p-type region is on the main surface of the semiconductor substrate such that surround the second n-type region. The first n-type region and the second n-type region are cathode regions, the p-type region is an anode region. The insulating film is formed on the main surface of the semiconductor substrate such that surround the p-type region in plan view.

The anode electrode is formed on the main surface of the semiconductor substrate having the p-type region. The equipotential ring electrode surrounds the anode electrode in an annular shape with a space from the anode electrode. The semi-insulating film is continuously formed from on an outer peripheral edge portion the anode electrode to on the equipotential ring.

In a state when the diode according to Patent Document 1 is reverse-biased, attributable to the potential difference between the anode electrode and the equipotential ring, a minute current flows through the semi-insulating film. The associated potential gradient, the depletion layer extends around an outer peripheral edge of the p-type region, the withstand voltage of the diode according to Patent Document 1 is improved. That is, the semi-insulating film acts as a resistive field plate.

SUMMARY

According to the knowledge acquired by the present inventors, the withstand voltage characteristics of the diode description in Patent Document 1 may fluctuate. And according to the knowledge acquired by the present inventors, in the diode described in Patent Document 1, cracks may occur in a semi-insulating film.

Disclosed embodiments provide the semiconductor device capable of suppressing the occurrence of cracks in the semi-insulating film while suppressing variations in the withstand voltage characteristics.

The Semiconductor device according to one embodiment has the semiconductor substrate having the main surface and a first impurity region formed in the main surface, a first electrode formed on the main surface having the first impurity region, the insulating film formed on the main surface such that surround the first electrode, a second electrode formed on the insulating film such that spaced apart from the first electrode and annularly surround the first electrode, and the semi-insulating film. The first electrode has the outer peripheral edge portion. The semi-insulating film is continuously formed from on the outer peripheral edge portion to on the second electrode. The outer peripheral edge portion includes a first corner portion. The second electrode has a second corner portion facing the first corner portion. The semi-insulating film on the insulating film is removed between the first corner and the second corner portion.

According to the semiconductor device according to the embodiments, while suppressing variations in the withstand voltage characteristics, it is possible to suppress cracks in the semi-insulating film.

DETAILED DESCRIPTION

Figure 1:
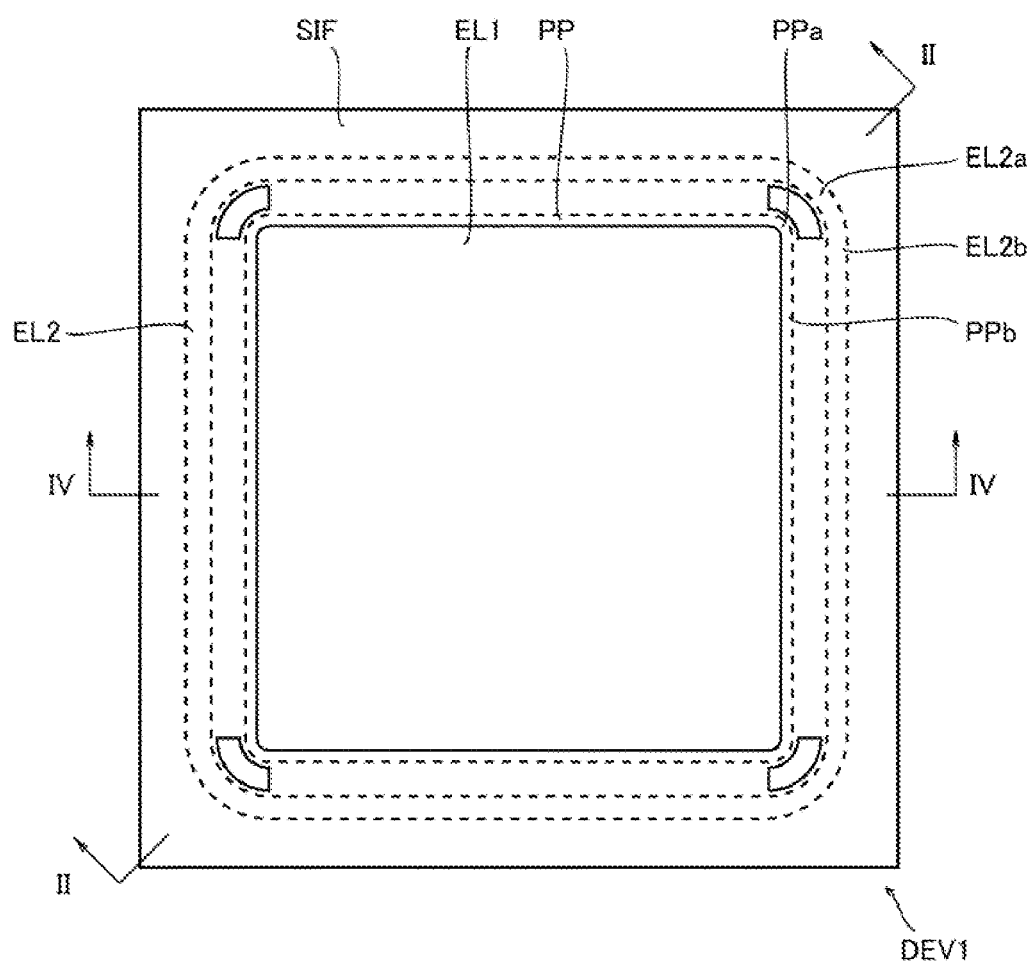
FIG. 1 is a plan view of a semiconductor device DEV1.

Details of the embodiments will be described with reference to the Figures. In the following figures, the same or corresponding parts are designated by the same reference numerals, and duplicate explanations will not be repeated.

First Embodiment

Figure 2:
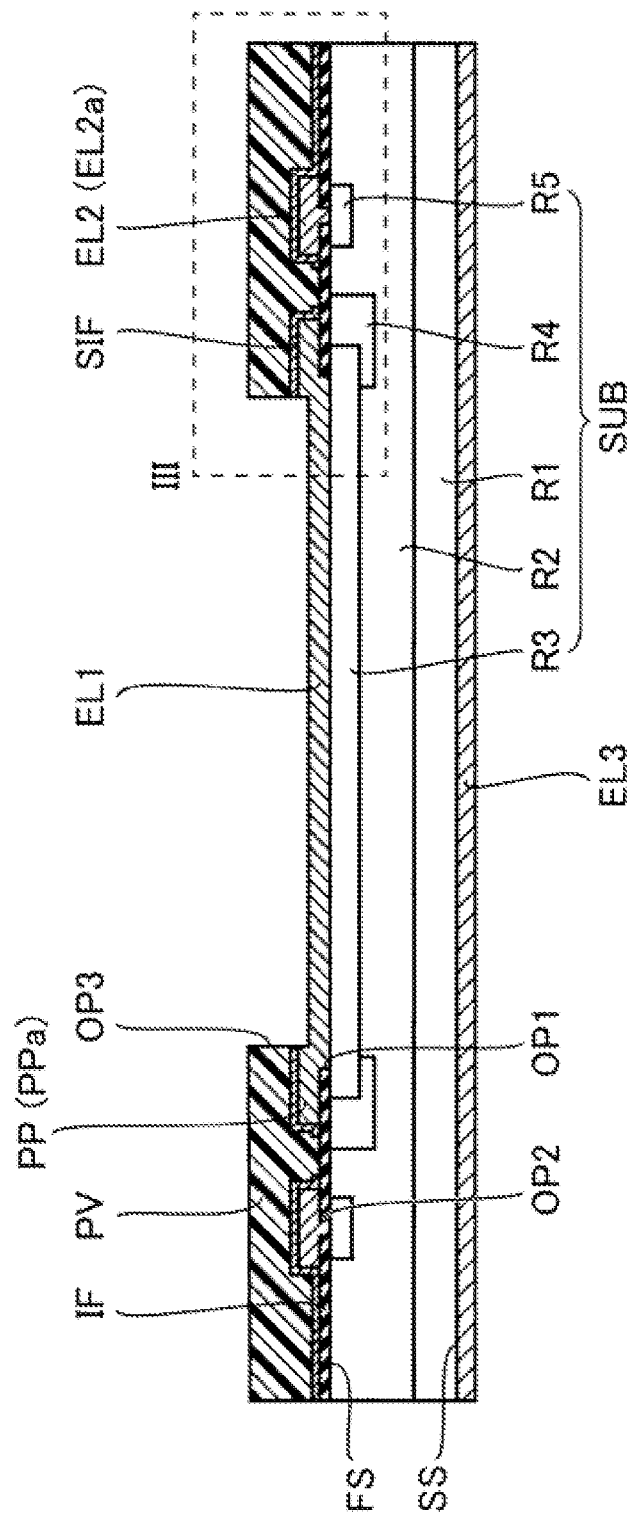
FIG. 2 is a cross-sectional view in II-II of FIG. 1.
Figure 3:
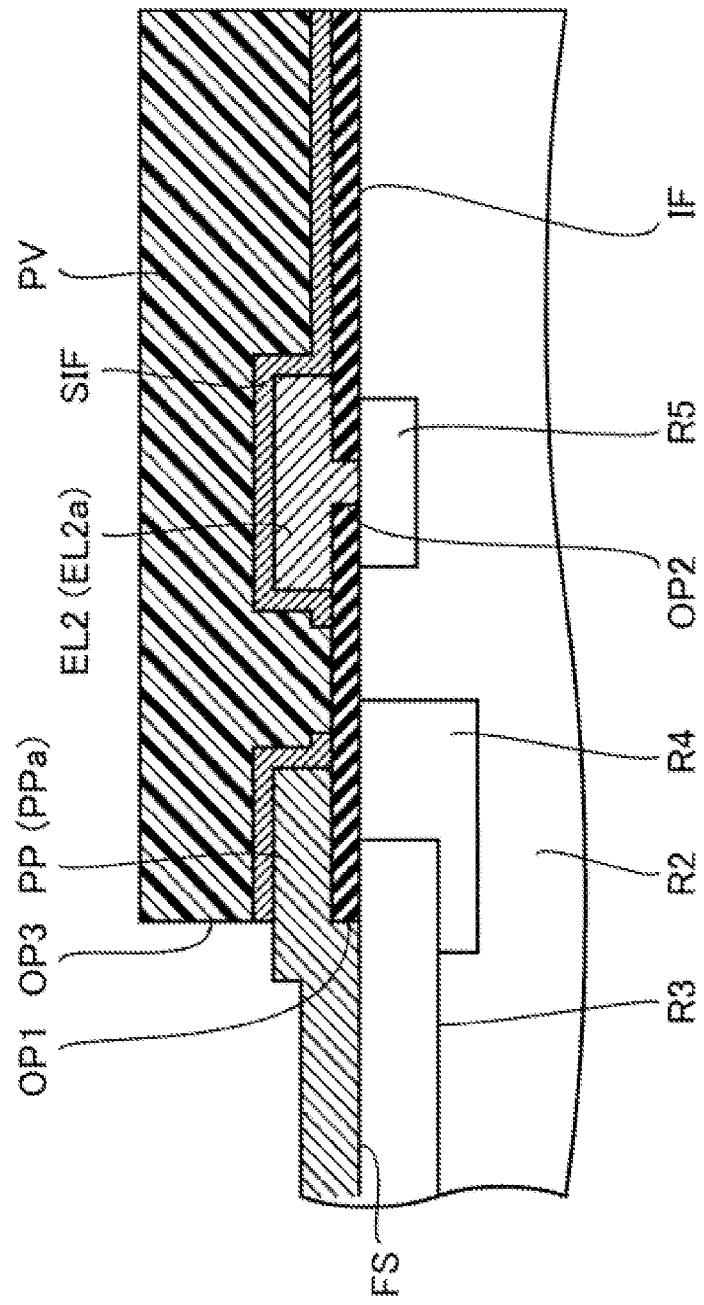
FIG. 3 is an enlarged view of a region III of FIG. 2.
Figure 4:
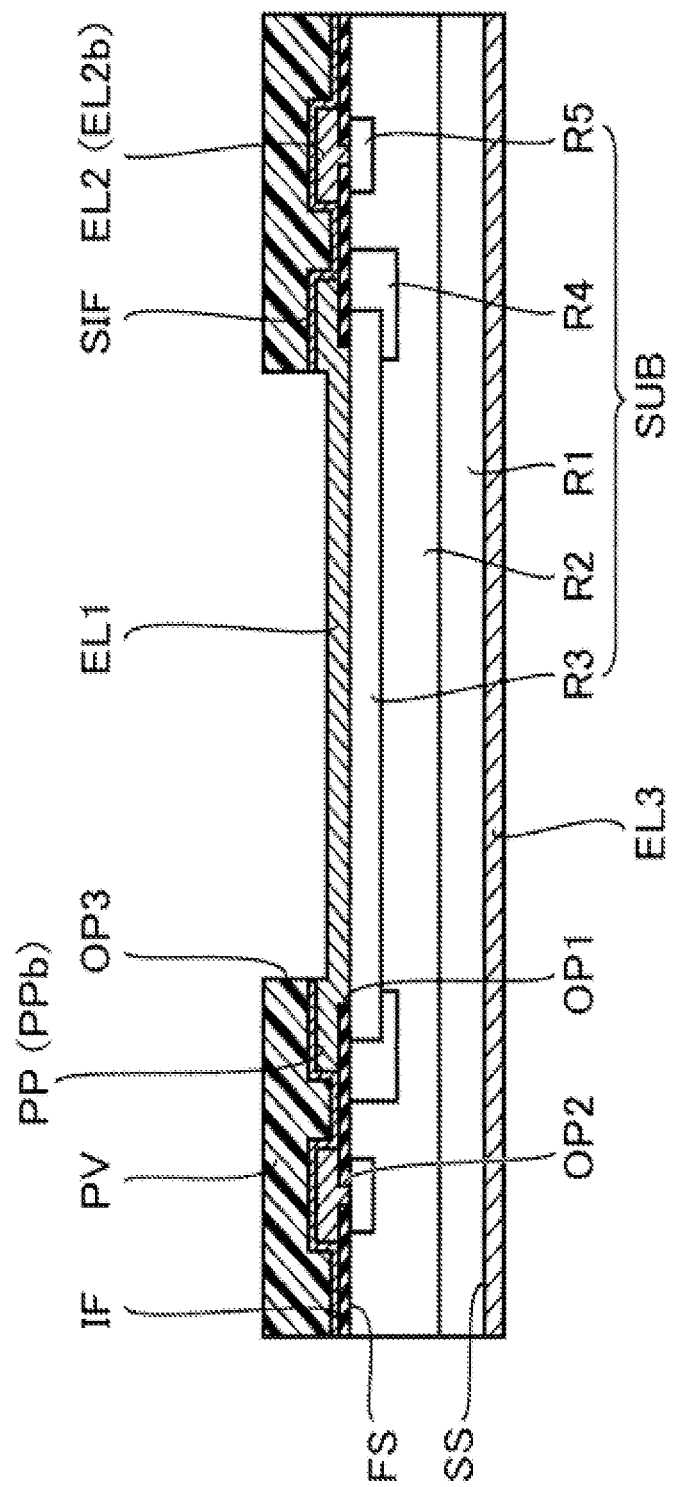
FIG. 4 is an enlarged cross-sectional view in IV-IV of FIG. 1.

The semiconductor device (hereinafter referred to as semiconductor device DEV1) according to the first embodiment will be described.
(Configuration of the Semiconductor Device DEV1)
FIG. 1 is a plan view of the semiconductor device DEV1. In FIG. 1, illustration of a passivation film PV is omitted. FIG. 2 is the cross-sectional view in II-II of FIG. 1. FIG. 3 is an enlarged view in the region III of FIG. 2. FIG. 4 is the enlarged cross-sectional view in IV-IV of FIG. 1. As shown in FIGS. 1, 2, 3 and 4, The semiconductor device DEV1 is a diode. The diode is preferably a fast recovery diode.

The semiconductor device DEV1 has a semiconductor substrate SUB, a first electrode EL1, an insulating film IF, a second electrode EL2, a semi-insulating film SIF, a third electrode EL3, and the passivation film PV.

The semiconductor substrate SUB has a first surface FS (main surface) and a second surface SS (back surface). The first surface FS and the second surface SS are an end face of the semiconductor substrate SUB in the thickness direction. The second surface SS is an opposite surface of the first surface FS. The semiconductor substrate SUB, for example, is formed of a single-crystal silicon.

The semiconductor substrate SUB has an impurity region R1, an impurity region R2, an impurity region R3, an impurity region R4, and an impurity region R5.

The impurity region R1 is formed on the second surface SS. The conductivity type of the impurity region R1 is a first conductivity type. The first conductivity type is, for example, n-type. The impurity region R2 is formed on the first surface FS. The second surface SS side of the impurity region R2 is in contact with the first surface FS side of the impurity region R1. The conductivity type of the impurity region R2 is the first conductivity type. An impurity concentration in the impurity region R2 is lower than the impurity concentration in the impurity region R1. The impurity region R1 and R2 are cathode regions.

The impurity region R3 is formed on the first surface FS. The conductivity type of the impurity region R3 is a second conductivity type. The second conductivity type is the opposite conductivity type of the first conductivity type. The second conductivity type is, for example, p-type. The impurity region R3 forms a pn junction between the impurity region R2.

The impurity region R3 is the anode region. The impurity region R4 is formed on the first surface FS. The impurity region R4 annularly surround the impurity region R3 in a plan view. The impurity region R4 is in contact with the impurity region R3 in a plan view. The conductivity type of the impurity region R4 is the second conductivity type. The impurity concentration in the impurity region R4 is lower than the impurity concentration in the impurity region R3. The impurity region R4 is RESURF (REduced SURface Field) regions.

The impurity region R5 is formed on the first surface FS, and the impurity region R5 annularly surround the impurity region R4 in a plan view. In a plan view, the impurity region R5 is separated from the impurity region R4 (between the impurity region R4 and the impurity region R5, are spaced apart). The impurity region R5 is a channel stopper region. The impurity region R5 is grounded.

The first electrode EL1 is formed on the first surface FS. More specifically, the first electrode EL1 is formed on the first surface FS having the impurity region R3. The first electrode EL1 is electrically connected to the impurity region R3. The first electrode EL1, in a plan view, has a rectangular shape with rounded corners. The first electrode EL1 is formed of, for example, aluminium. The first electrode EL1 is the anode electrode.

The first electrode EL1 has an outer peripheral edge PP. An outer peripheral edge portion PP is a portion of the first electrode EL1 located on the outer peripheral edge of the first electrode EL1 in a plan view. The outer peripheral edge portion PP may be formed on the insulating film IF. In this case, the outer peripheral edge PP functions as a conductive field plate.

The outer peripheral edge portion PP has a corner portion PPa and a straight portion PPb. In a plan view, the corner portion PPa is located at the corners of the first electrode EL1. In a plan view, the corner portion PPa has a convex curved shape toward the second electrode EL2. The straight portion PPb is continuous to the end of the corner portion PPa. The straight portion PPb, in a plan view, it extends linearly.

The insulating film IF is formed on the first surface FS. The insulating film IF, in a plan view, surrounds the first electrode. An opening OP1 and an opening OP2 are formed in the insulating film IF. The opening OP1 and the opening OP2 penetrates the insulating film IF in the thickness direction. The first electrode EL1 is electrically connected to the impurity region R3 through the openings OP1. The second electrode EL2 is electrically connected to the impurity region R5 through the openings OP2. The insulating film IF is formed of, for example, silicon oxide.

The second electrode EL2 is formed on the insulating film IF. The second electrode EL2, in a plan view, surrounds the first electrode EL1. The second electrode EL2 is annularly shaped in a plan view. The second electrode EL2, in a plan view, has a shape along the outer peripheral edge portion PP. The second electrode EL2 is formed on the insulating film IF on the first surface FS where the impurity region R5 is formed.

In a plan view, the second electrode EL2 is spaced apart from the first electrode EL1 (There is a gap between the first electrode EL1 and the second electrode EL2). From another point of view, the insulating film IF is exposed between the first electrode EL1 and the second electrode EL2. The second electrode EL2 is formed of, for example, aluminium.

The second electrode EL2 has a corner portion EL2a and a straight portion EL2b. The corner portion EL2a is opposed to the corner portion PPa with a space therebetween. The straight portion EL2b is continuous to the corner portion EL2a. The straight portion EL2b, in a plan view, it extends in a straight line. The straight portion EL2b, in a plan view, it extends parallel to the straight portion PPb.

The semi-insulating film SIF is formed by a semi-insulating material. The resistivity of the semi-insulating film SIF is, for example, greater than or equal to 105 Ωcm and less than or equal to 1013 Ωcm. The semi-insulating film SIF is, for example, a semi-insulating silicon nitride film. The specific resistance of the semi-insulating silicon nitride film can be adjusted by adjusting the amount of silicon in the film.

The semi-insulating film SIF is not limited thereto. The semi-insulating film SIF may be a polysilicon film. The resistivity of the polysilicon film is adjusted by adjusting the doping amount of impurities in the film.

The semi-insulating film SIF is continuously formed from on the outer peripheral edge PP to on the second electrode EL2. That is, the semi-insulating film SIF is formed on the outer peripheral edge PP, on the second electrode EL2, and on the insulating film IF between the first electrode EL1 and the second electrode EL2. Thus, the first electrode EL1 and the second electrode EL2 is electrically connected.

In a state where the semiconductor device DEV1 is reverse-biased, a minute current flows through the semi-insulating film SIF due to the potential difference between the first electrode EL1 and the second electrode EL2. The potential gradient by this current flow through the semi-insulating film SIF, the depletion layer tends to extend in the vicinity of the outer peripheral edge of the impurity region R3 in a plan view, the withstand voltage of the semiconductor device DEV1 is improved. That is, the semi-insulating film SIF functions as the resistive field plate.

However, the semi-insulating film SIF on the insulating film IF between the corner portion PPa and the corner portion EL2a is at least partially removed. Thus, the semi-insulating film SIF on the corner portion PPa and the semi-insulating film SIF on the corner portion EL2a is separated.

The third electrode EL3 is formed on the second surface SS. The third electrode EL3 is electrically connected to the impurity region R1. That is, the third electrode EL3 is a cathode electrode. The third electrode EL3 is formed of, for example, aluminium.

The passivation film PV is formed such that cover the semi-insulating film SIF. An opening OP3 is formed in the passivation film PV. The opening OP3 penetrates the passivation film PV in the thickness direction. The first electrode EL1 are exposed from the opening OP3. The passivation film PV is formed of, for example, polyimide.

(Methods of Manufacturing Semiconductor Device DEV1)

Figure 5:
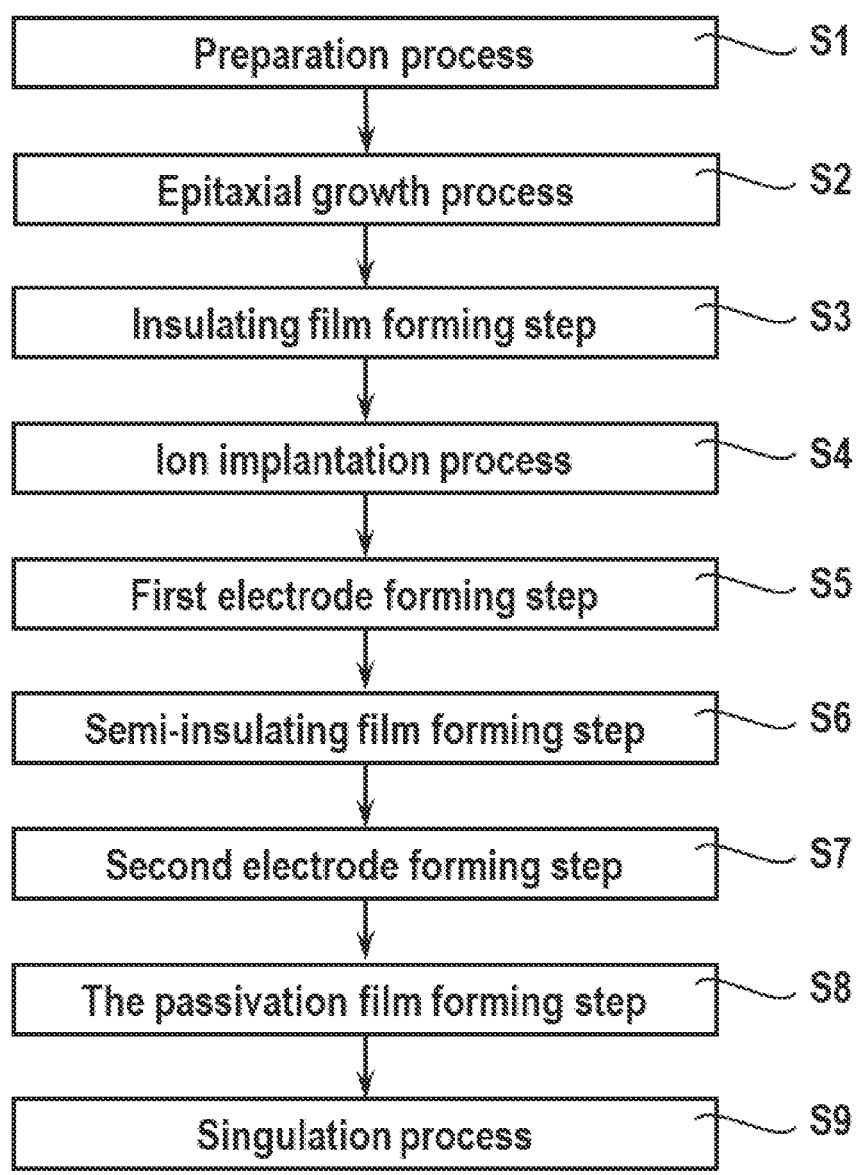
FIG. 5 is a process diagram showing manufacturing method of the semiconductor device DEV1.

FIG. 5 is a process diagram showing manufacturing method of the semiconductor device DEV1. As shown in FIG. 5, the manufacturing method of the semiconductor device DEV1 has a preparing step S1, the epitaxial growth step S2, the insulating film forming step S3, the ion implantation step S4, the first electrode-forming step S5, the semi-insulating film-forming step S6, the second electrode-forming step S7, a passivation film-forming step S81, and a singulation step S9.

Figure 6:
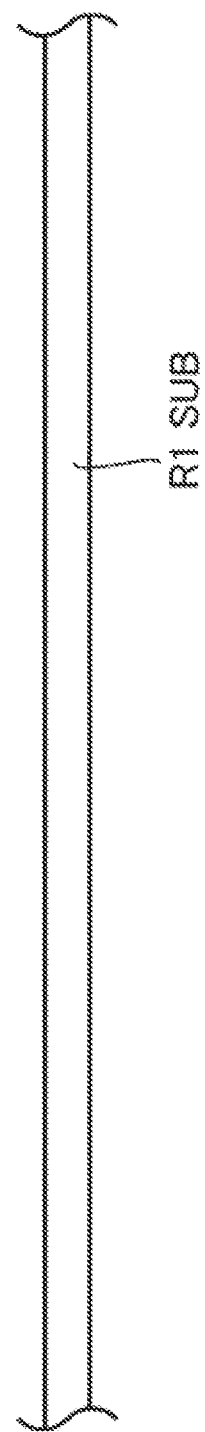
FIG. 6 is a cross-sectional view of the semiconductor device DEV1 in a preparatory step S1.

FIG. 6 is the cross-sectional view of the semiconductor device DEV1 in the preparatory step S1. As shown in FIG. 6, in the preparatory step S1, the semiconductor substrate SUB is prepared. The semiconductor substrate SUB prepared in the preparing step S1 have only the impurity region R1.

Figure 7:
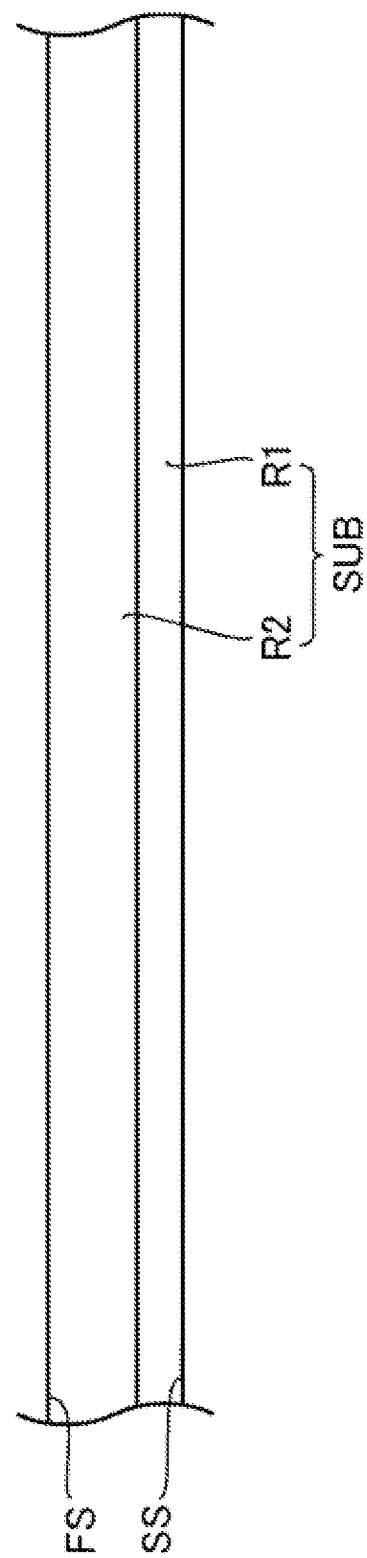
FIG. 7 is a cross-sectional view of the semiconductor device DEV1 in an epitaxial growth step S2.

FIG. 7 is the cross-sectional view of the semiconductor device DEV1 in the epitaxial growth step S2. As shown in FIG. 7, in the epitaxial growth step S2, the impurity region R2 is epitaxially grown on the impurity region R1 by, for example, the CVD (Chemical Vapor Deposition) method.

Figure 8:
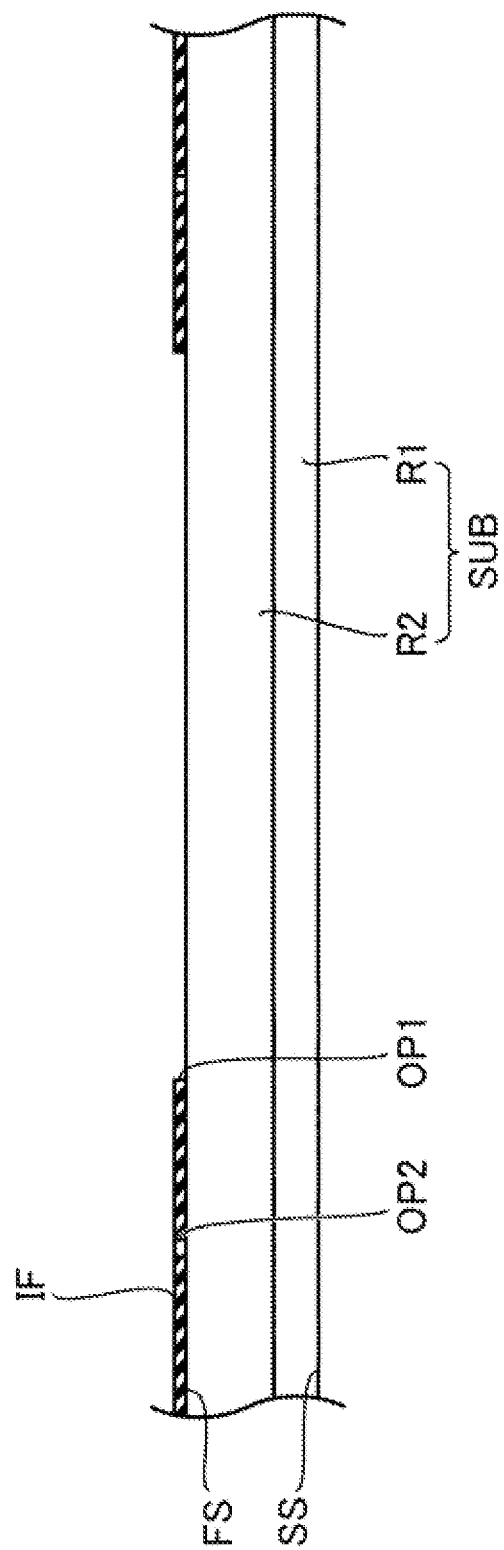
FIG. 8 is a cross-sectional view of the semiconductor device DEV1 in an insulating film forming step S3.

FIG. 8 is the cross-sectional view of the semiconductor device DEV1 in the insulating film forming step S3. As shown in FIG. 8, in the insulating film forming step S3, the insulating film IF is formed. In the formation of the insulating film IF, first, a material constituting the insulating film IF is formed into a film by a thermal oxidation method, a CVD method, or the like. Second, the film is etched using a mask patterned by photolithography. Thus, the insulating film IF is formed.

Figure 9:
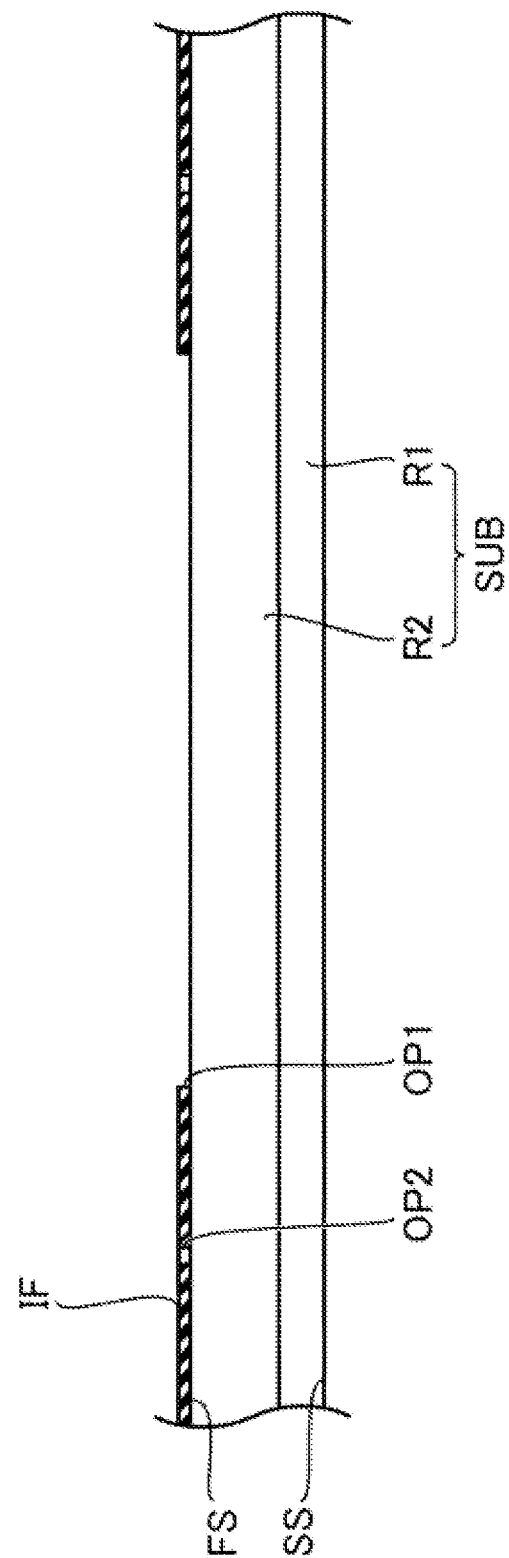
FIG. 9 is a cross-sectional view of the semiconductor device DEV1 in an ion implantation step S4.

FIG. 9 is the cross-sectional view of the semiconductor device DEV1 in the ion implantation step S4. As shown in FIG. 8, in the ion implantation step S4, by ion implantation is performed, the impurity region R3, the impurity region R4 and the impurity region R5 are formed.

Figure 10:
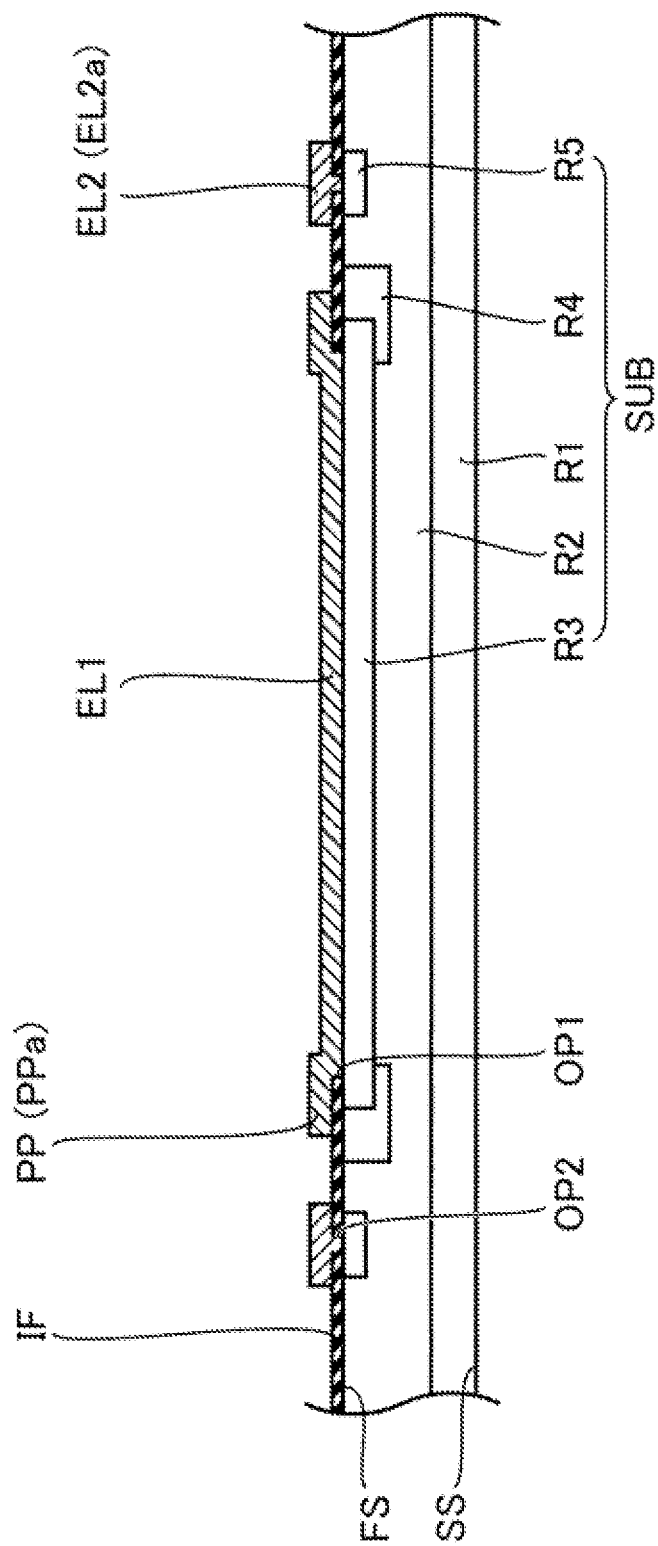
FIG. 10 is a cross-sectional view of the semiconductor device DEV1 in a first electrode-forming step S5.

FIG. 10 is the cross-sectional view of the semiconductor device DEV1 in the first electrode-forming step S5. As shown in FIG. 10, in the first electrode forming process S5, the first electrode EL1 and the second electrode EL2 are formed. In forming the first electrode EL1 and the second electrode EL2, first, a material constituting the first electrode EL1 and the second electrode EL2 is formed, for example, by using a sputtering method. Second, the film is etched using a mask patterned by photolithography. Thus, the first electrode EL1 and the second electrode EL2 are formed.

Figure 11:
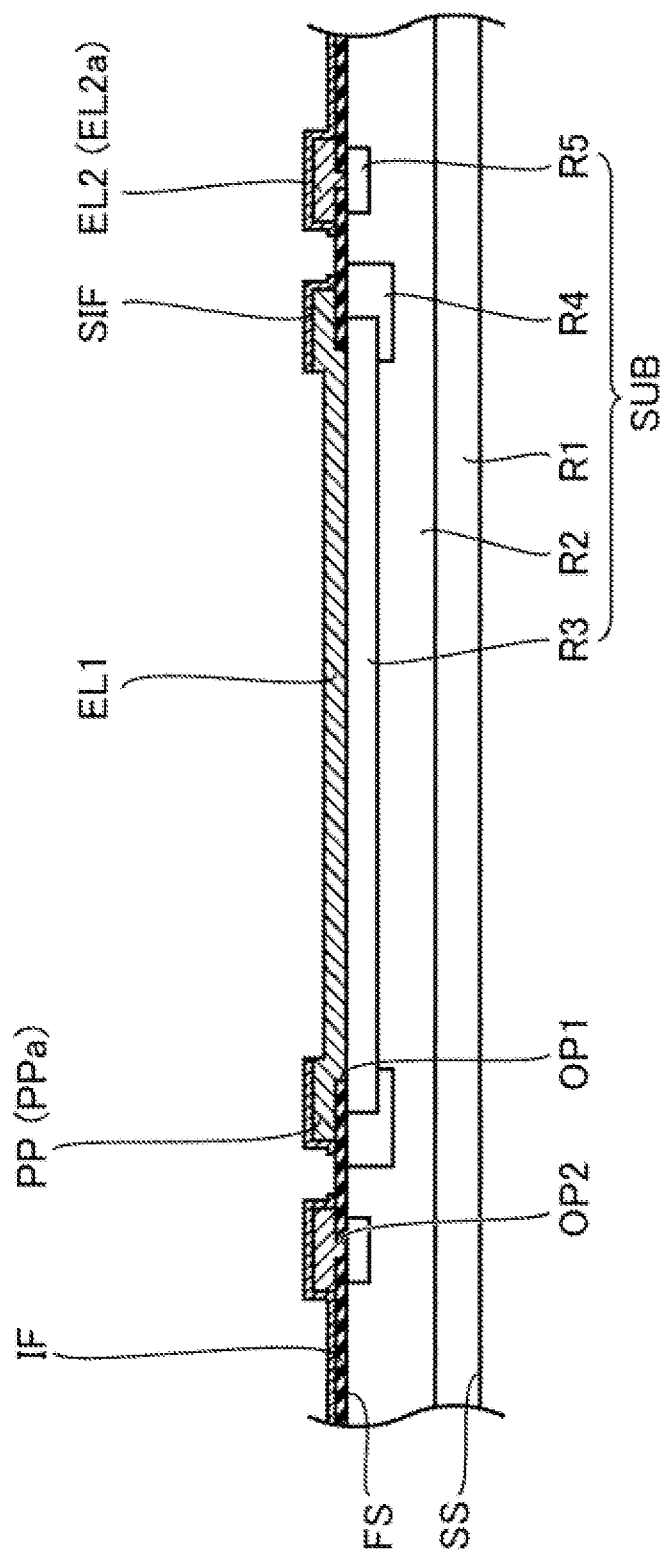
FIG. 11 is a cross-sectional view of the semiconductor device DEV1 in a semi-insulating film-forming step S6.

FIG. 11 is the cross-sectional view of the semiconductor device DEV1 in the semi-insulating film-forming step S6. As shown in FIG. 11, the semi-insulating film-forming step S6, the semi-insulating film SIF is formed. In the formation of the semi-insulating film SIF, first, the material constituting the semi-insulating film SIF is formed into a film by a CVD method or the like. Second, the film is etched using a mask patterned by photolithography. Thus, the semi-insulating film SIF is formed.

Figure 12:
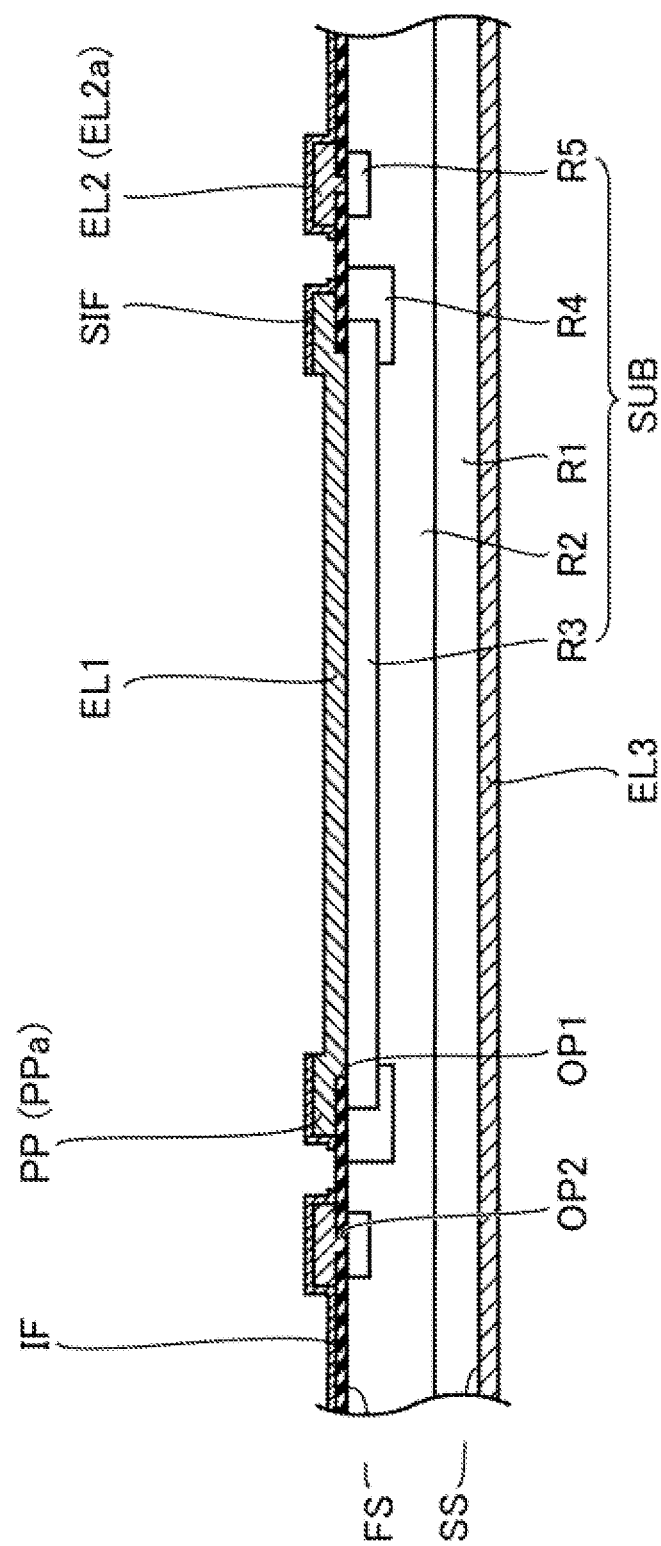
FIG. 12 is a cross-sectional view of the semiconductor device DEV1 in a second electrode-forming step S7.

FIG. 12 is the cross-sectional view of the semiconductor device DEV1 in the second electrode-forming process S7. As shown in FIG. 12, in the second electrode-forming step S7, the third electrode EL3 is formed. The third electrode EL3 is formed by forming a film of a material constituting the third electrode EL3 using, for example, a sputtering method.

In the passivation film-forming step S81, the passivation film PV is formed. In the formation of the passivation film PV, first, a material constituting the passivation film PV is formed into a film. Second, the film is patterned using photolithography. Consequently, the passivation film PV is formed.

In the singulation step S9, singulation of the semiconductor device DEV1 is performed. This singulation is performed by dicing using, for example, a dicing blade. Thus, the semiconductor device DEV1 of the construction shown in FIGS. 1 to 4 is manufactured.

In the on examples, in the preparing step S1, the semiconductor substrate SUB having only the impurity region R1 is prepared. However, in the preparing step S1, the semiconductor substrate SUB having only the impurity regions R2 may be prepared. In this case, the epitaxial growth step S2 is not performed, and the impurity region R1 is formed by ion implantation from the second surface SS side. The formation of the impurity region R1 by this ion implantation is performed before the second electrode-forming step S7.

(Effect of the Semiconductor Equipment DEV1)

The semiconductor device according to the comparative example has the same configuration as the semiconductor device DEV1 except that the semi-insulating film SIF on the insulating film IF is not removed between the corner portion PPa and the corner portion EL2a.

Figure 13:
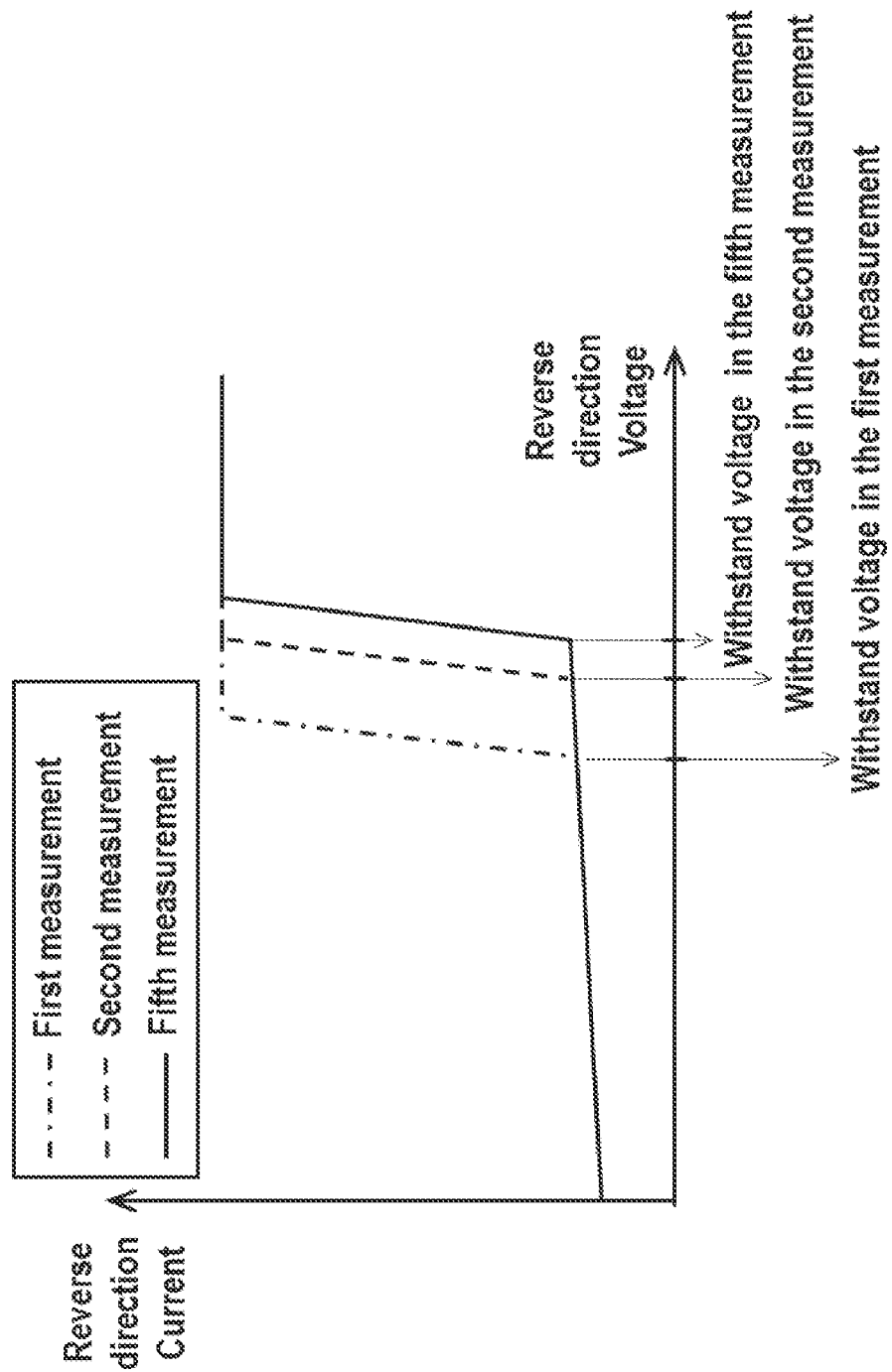
FIG. 13 is a schematic graph showing the withstand voltage characteristics in the semiconductor device according to comparative example.

FIG. 13 is a schematic graph showing the withstand voltage characteristics in the semiconductor device according to the comparative example. In FIG. 13, the horizontal axis is a reverse voltage and the vertical axis is a reverse current. As shown in FIG. 13, the withstand voltage characteristics of semiconductor device according to the comparative examples fluctuate each time measurements are repeated. The pn junction between the impurity region R2 and the impurity region R3 is liable to be avalanche-collapsed in the vicinity of the corner portion in a plan view of the impurity region R2.

During this avalanche collapse, a portion of the excess carriers (electrons) generated in the semiconductor substrate SUB is accumulated in the semi-insulating film SIF on the insulating film IF between the corner portion PPa and the corner portion EL2a. Consequently, the electric field distribution changes in the semiconductor substrate SUB below the semi-insulating SIF. This is considered to be the reason why the withstand voltage characteristics of the semiconductor device according to the comparative examples fluctuate every time measurements are repeated.

On the other hand, in the semiconductor device DEV1, the semi-insulating film SIF on the insulating film IF between the corner portion PPa and the corner portion EL2a is at least partially removed. Therefore, in the semiconductor device DEV1, excessive carriers formed during avalanche collapse is hard to accumulate in the semi-insulating film SIF on the insulating film IF is between the corner portion PPa and the corner portion EL2a. Therefore, according to the semiconductor device DEV1, it is possible to suppress variations in the withstand voltage characteristics.

The semi-insulating film SIF on the insulating film IF between the corner portion PPa and the corner portion EL2a, such as when the thermal cycling is applied to the semiconductor device DEV1, it is likely to be a stress concentration point. Therefore, in the semiconductor device according to the comparative example, cracks may occur in the semi-insulating film SIF on the insulating film IF between the corner portion PPa and the corner portion EL2a.

On the other hand, in the semiconductor device DEV1, the semi-insulating film SIF on the insulating film IF between the corner portion PPa and the corner portion EL2a is at least partially removed, the semi-insulating film SIF on the insulating film IF between the corner portion PPa and the corner portion EL2a can not become stress concentration point. Thus, according to the semiconductor device DEV1, it is possible to suppress cracks occur in the semi-insulating film SIF.

In the semiconductor device DEV1, the impurity region R4 is not divided below the insulating film IF between the corner portion PPa and the corner portion EL2a. In the semiconductor device DEV1, the semi-insulating film SIF on the insulating film IF between the straight portion PPb and the straight portion EL2b has a certain degree of electric field relaxation effect on the semiconductor substrate SUB below the insulating film IF between the corner portion PPa and the corner portion EL2a. Therefore, in the semiconductor device DEV1, even if the semi-insulating film SIF on the insulating film IF between the corner portion PPa and the corner portion EL2a is at least partially removed, the withstand voltage is maintained.

In the semiconductor device DEV1, the semi-insulating film SIF on the corner portion PPa and the corner portion EL2a remains. Therefore, in the semiconductor device DEV1, these the semi-insulating film SIF can prevent the corner portion PPa and the corner portion EL2a from being corroded by the moisture or the like that has passed through the passivation film PV.

In the semiconductor device DEV1, removing the semi-insulating film SIF is carried out on the insulating film IF between the corner portion PPa and corners EL2a. Since the insulating film IF between the corner portion PPa and the corner portion EL2a is flat, it is easy to accurately form a mask used when carried out this removing by a photolithography method.

In the on description, the case where the semiconductor device DEV1 is a diode has been described, but the semiconductor device DEV1 is not limited thereto. The semiconductor device DEV1 may be, for example, a IGBT (Insulated Gate Bipolar Transistor). In this case, the impurity region R3 becomes an emitter region of the IGBT.

Second Embodiment

Hereinafter, the semiconductor device (hereinafter referred to as semiconductor device DEV2) according to the second embodiment will be described. Here, the difference from the semiconductor device DEV1 will be mainly described, and the duplicated description will not be repeated.
(Configuration of the Semiconductor Device DEV2)

The semiconductor device DEV2 has the semiconductor substrate SUB, the first electrode EL1, the insulating film IF, the second electrode EL2, the semi-insulating film SIF, the third electrode EL3, and the passivation film PV. In this regard, the configuration of the semiconductor device DEV2 is common to the configuration of the semiconductor device DEV1.

Figure 14:
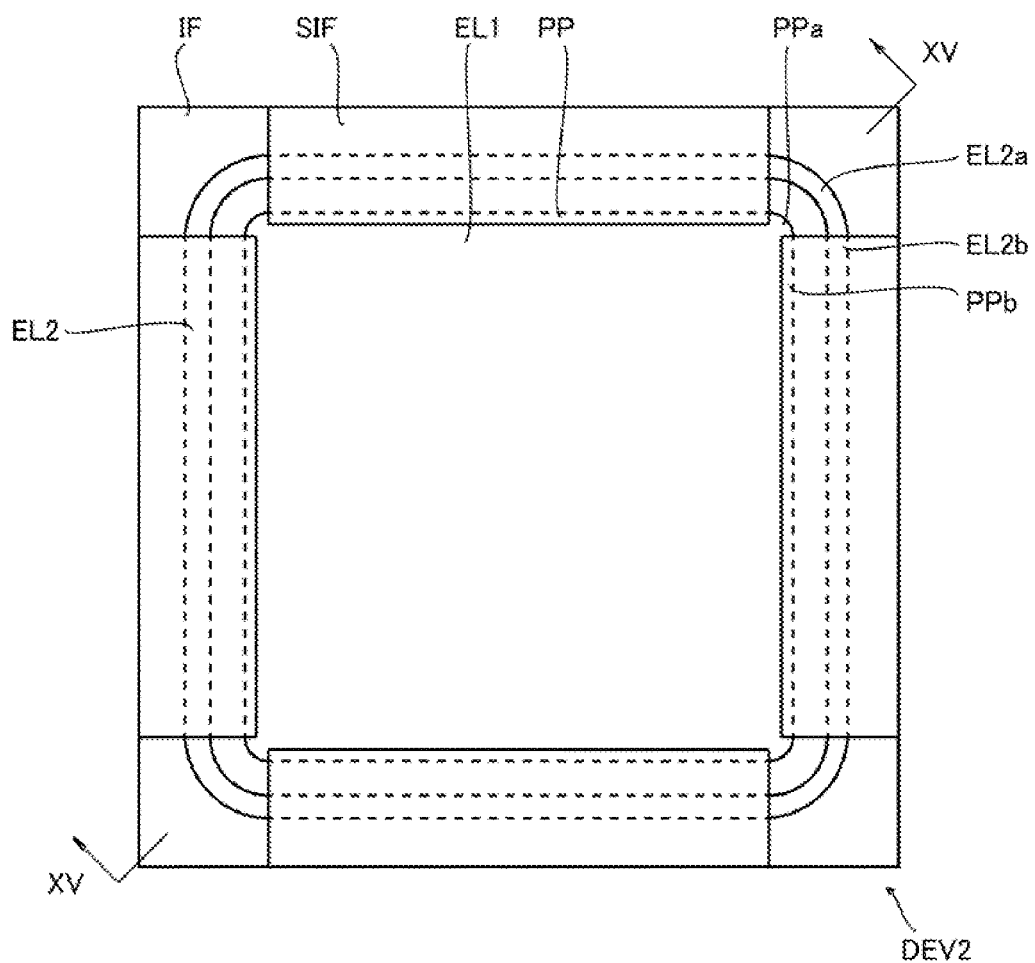
FIG. 14 is a plan view of a semiconductor device DEV2.
Figure 15:
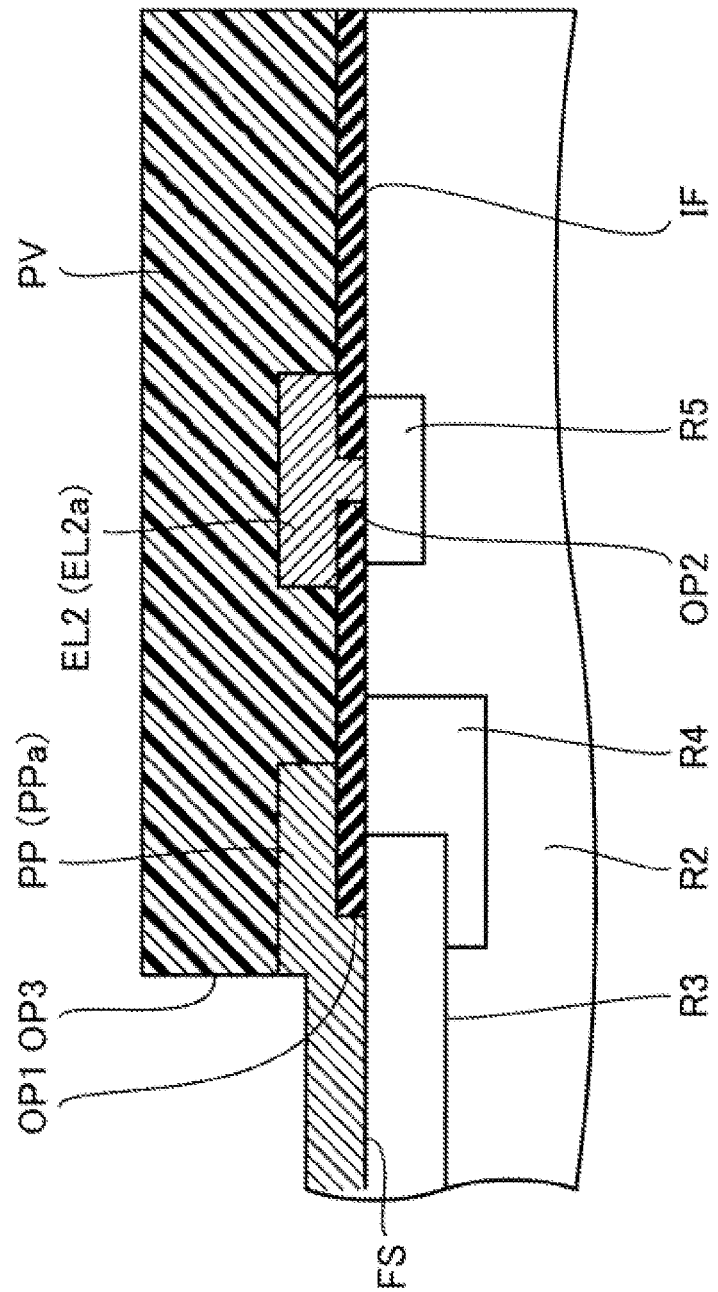
FIG. 15 is an enlarged cross-sectional view in XV-XV of FIG. 14.

FIG. 14 is a plan view of the semiconductor device DEV2. In FIG. 14, the passivation film PV is omitted. FIG. 15 is the enlarged cross-sectional view of XV-XV in FIG. 14. As shown in FIGS. 14 and 15, in the semiconductor device DEV2, the semi-insulating film SIF is also removed on the corner portion PPa and EL2a. In this regard, the configuration of the semiconductor device DEV2 is different from that of the semiconductor device DEV1.
(Method of Manufacturing the Semiconductor Device DEV2)

The manufacturing method of the semiconductor device DEV2 is common to the manufacturing method of the semiconductor device DEV1 except for the semi-insulating film-forming step S6. In the manufacturing method of the semiconductor device DEV2, in the semi-insulating film-forming step S6, the material constituting the semi-insulating film SIF formed on the film is patterned so that the semi-insulating film SIF does not remain on the corner portion PPa and the corner portion EL2a.
(Effect of the Semiconductor Equipment DEV2)

Among the semi-insulating film SIF on the outer peripheral edge PP, stress tends to be relatively concentrated the semi-insulating film SIF on the corner portion PPa when a temperature cycle or the like is applied. Similarly, among the semi-insulating film SIF on the second electrode EL2, stress tends to be relatively concentrated on the semi-insulating film SIF on the corner portion EL2a. In the semiconductor device DEV2, since the semi-insulating film SIF on the corner portion PPa and the corner portion EL2a is also removed, crack generation in the semi-insulating film SIF is further suppressed.

Third Embodiment

Hereinafter, the semiconductor device (hereinafter referred to as semiconductor device DEV3) according to the third embodiment will be described. Here, the difference from the semiconductor device DEV1 will be mainly described, and the duplicated description will not be repeated.
(Configuration of the Semiconductor Device DEV3)

The semiconductor device DEV2 has the semiconductor substrate SUB, the first electrode EL1, the insulating film IF, the second electrode EL2, the semi-insulating film SIF, the third electrode EL3, and the passivation film PV. In this regard, the configuration of the semiconductor device DEV3 is common to the configuration of the semiconductor device DEV1.

Figure 16:
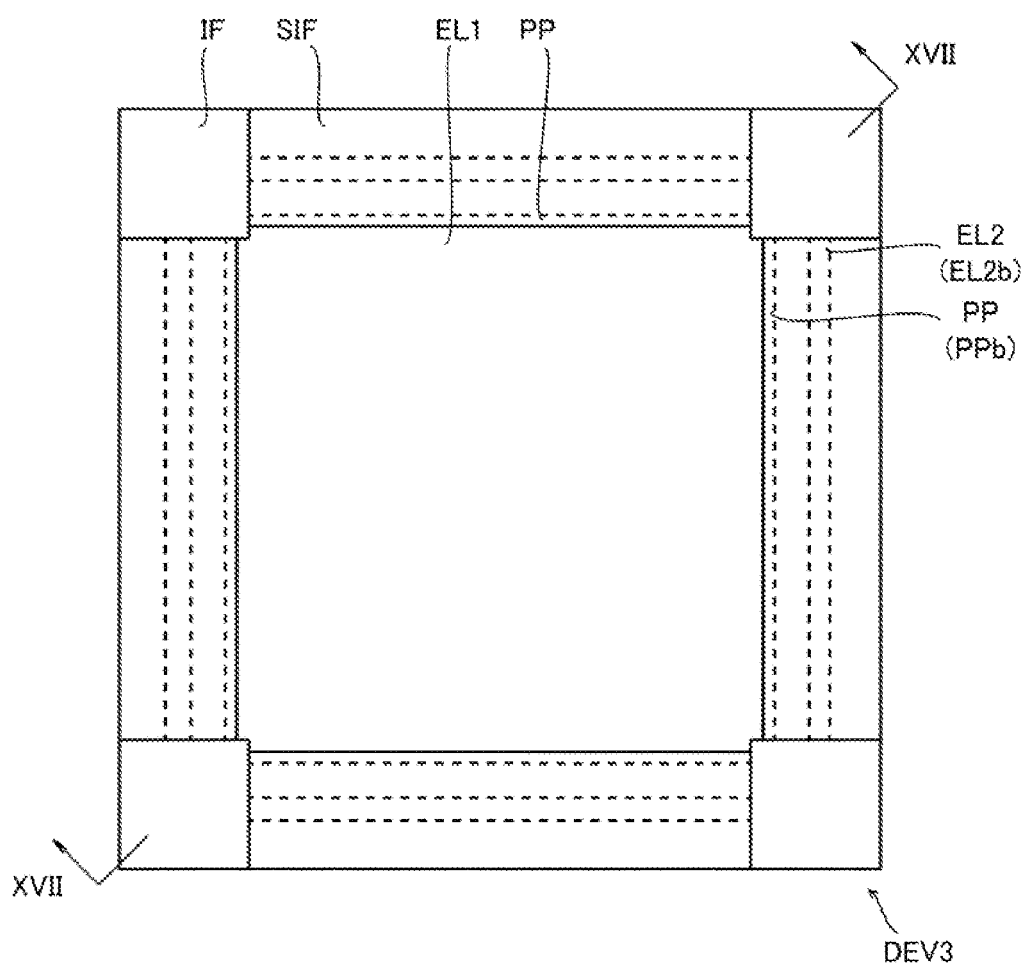
FIG. 16 is a plan view of a semiconductor device DEV3.
Figure 17:
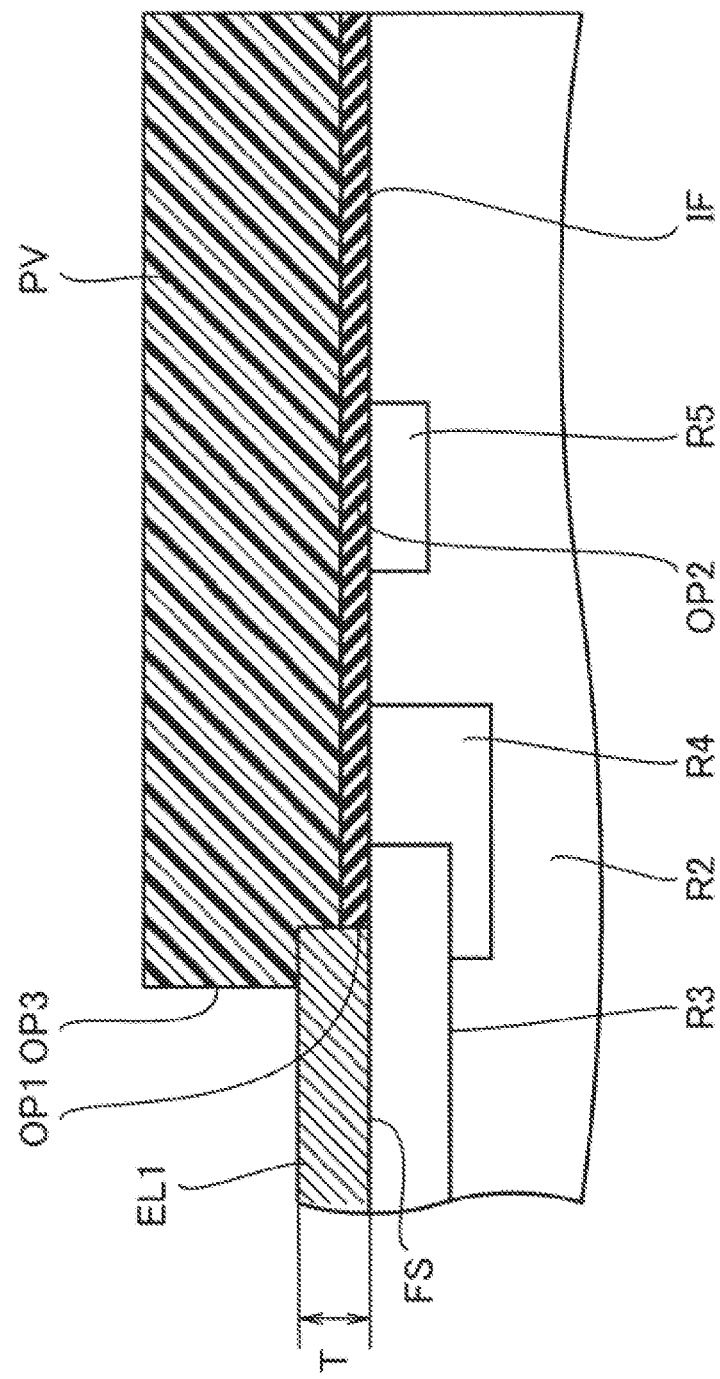
FIG. 17 is an enlarged cross-sectional view in XVII-XVII of FIG. 16.

FIG. 16 is a plan view of the semiconductor device DEV3. In FIG. 16, the passivation film PV is not shown. FIG. 17 is the enlarged cross-sectional view of XVII-XVII in FIG. 16. As shown in FIGS. 16 and 17, in the semiconductor device DEV3, the first electrode EL1 has a cross shape in a plan view. From another point of view, the first electrode EL1 in the semiconductor device DEV3 has a shape in which the corner portion in a plan view is removed from the first electrode EL1 in the semiconductor device DEV1. Consequently, the outer peripheral edge portion PP in the semiconductor device DEV3 does not have the corner portion PPa.

In the semiconductor device DEV3, the second electrode EL2 does not have the corner portion EL2a. That is, in the semiconductor device DEV3, the second electrode EL2 is not annular, it is composed of only four straight portion EL2b.

In the semiconductor device DEV3, the outer peripheral edge PP does not have the corner portion PPa, the second electrode EL2 does not have the corner portion EL2a, it does not have the semi-insulating film SIF that is continuously formed from on the corner portion PPa to on the corner portion EL2a.

The thickness of the first electrode EL1 and the second electrode EL2 is defined as a thickness T. The thickness T in the semiconductor device DEV3 is preferably larger than the thickness T in the semiconductor device DEV1. In the semiconductor device DEV3, the thickness T is, for example, or more. In these respects, the configuration of the semiconductor device DEV3 is different from that of the semiconductor device DEV1.

(Method of Manufacturing the Semiconductor Device DEV3)

The manufacturing method of the semiconductor device DEV3 is common to the manufacturing method of the semiconductor device DEV1 except for the first electrode-forming step S5 and the semi-insulating film-forming step S6. In the manufacturing method of the semiconductor device DEV3, in the first electrode-forming step S5, the first electrode EL1 and the second electrode EL2 are patterned into the shapes shown in FIG. 16.

In the manufacturing method of the semiconductor device DEV3, in the semi-insulating film-forming step S6, the materials constituting the semi-insulating film SIF formed on a film is patterned so that only the portion formed continuously from the straight portion PPb to the straight portion EL2b remain. In these respects, the manufacturing method of the semiconductor device DEV3 differs from the manufacturing method of the semiconductor device DEV1.

(Effect of the Semiconductor Equipment DEV3)

In the case where the thickness T is increased, the level difference between the surfaces of the first electrode EL1 and the second electrode EL2 and the surface of the insulating film IF is increased. Consequently, it becomes difficult to pattern the mask for locally removing the semi-insulating film SIF on the insulating film IF located between the corner portion PPa and the corner portion EL2a using a photolithography method.

In the semiconductor device DEV3, the outer peripheral edge PP does not have the corner portion PPa, the second electrode EL2 does not have the corner portion EL2a, it does not have the semi-insulating film SIF that is continuously formed from on the corner portion PPa to on the corner portion EL2a.

Therefore, according to the semiconductor device DEV3, the withstand voltage variation caused by the accumulation of excessive carriers generated during avalanche collapse in the semi-insulating film SIF on the insulating film IF between the corner portion PPa and the corner portion EL2a does not occur. Further, according to the semiconductor device DEV3, since there is no need to locally remove the semi-insulating film SIF on the insulating film IF between the corner portion PPa and the corner portion EL2a, it is possible to increase the thickness T.

Although the invention made by the present inventor has been specifically described based on the embodiment, the present invention is not limited to the embodiment described on, and it is needless to say that various modifications can be made without departing from the gist thereof.

What is claimed is:

1. A semiconductor device comprising:
   a semiconductor substrate having a main surface and a first impurity region formed on the main surface;
   a first electrode formed on the first impurity region;
   an insulating film formed on the main surface such that the insulating film surrounds the first electrode in plan view;
   a second electrode formed on the insulating film such that the second electrode is spaced apart from the first electrode and annularly surrounds the first electrode in plan view; and
   a semi-insulating film, wherein
   the first electrode has an outer peripheral edge portion including a first corner,
   the second electrode has an inner edge including a second corner,
   the first corner and the second corner face each other across a space between the outer peripheral edge portion of the first electrode and the inner edge of the second electrode, and
   the semi-insulating film extends from the outer peripheral edge portion to the second electrode to cover the outer peripheral edge portion of the first electrode to an outer edge of the second electrode except the space between the outer peripheral edge portion of the first electrode and the inner edge of the second electrode in plan view,
   wherein the semi-insulating film is continuously removed from the first corner to the second corner.

2. The semiconductor device according to claim 1, wherein
   the semiconductor substrate has a second impurity region formed on the main surface such that the second impurity region annularly surrounds the first impurity region in contact with the first impurity region in plan view,
   a conductive type of the second impurity region is same as a conductive type of the first impurity region, and
   an impurity concentration of the second impurity region is lower than an impurity concentration of the first impurity region.

3. The semiconductor device according to claim 2, wherein
   the semiconductor substrate has a third impurity region formed on the main surface such that the third impurity region is spaced apart from the second impurity region and annularly surrounds the second impurity region in plan view,
   the second electrode is electrically connected to the third impurity region, and
   the third impurity region is electrically grounded.

4. The semiconductor device according to claim 1, wherein the semi-insulating film is a semi-insulating silicon nitride film.

5. The semiconductor device according to claim 1, wherein
   the semiconductor device is a diode, and
   the first impurity region is an anode region of the diode.

6. The semiconductor device according to claim 1, wherein
   the semiconductor device is an IGBT, and
   the first impurity region is an emitter region of the IGBT.

* * * * *